United States Patent [19]

Gheewala

[11] Patent Number: 5,157,627
[45] Date of Patent: Oct. 20, 1992

[54] METHOD AND APPARATUS FOR SETTING DESIRED SIGNAL LEVEL ON STORAGE ELEMENT

[75] Inventor: Tushar R. Gheewala, Cupertino, Calif.

[73] Assignee: CrossCheck Technology, Inc., San Jose, Calif.

[21] Appl. No.: 554,313

[22] Filed: Jul. 17, 1990

[51] Int. Cl.[5] .............................................. G11C 13/00
[52] U.S. Cl. ......................... 365/189.01; 365/189.03; 365/201
[58] Field of Search ..................... 365/189.01, 189.02, 365/189.03, 189.04, 189.08, 189.05, 201

[56] References Cited

U.S. PATENT DOCUMENTS

| | | |
|---|---|---|
| 3,761,675 | 9/1973 | Mason et al. . |
| 3,795,859 | 3/1974 | Benante et al. . |
| 3,806,891 | 4/1974 | Eichelberger et al. . |
| 4,293,919 | 10/1981 | Dasgupta et al. . |
| 4,513,418 | 4/1985 | Bardell, Jr. et al. . |
| 4,517,672 | 5/1985 | Pfleiderer et al. . |
| 4,613,970 | 9/1986 | Masuda et al. . |
| 4,749,947 | 6/1988 | Gheewala . |

FOREIGN PATENT DOCUMENTS 0223714  5/1987  European Pat. Off. .

OTHER PUBLICATIONS

"Design for Testability -A Survey", by T. W. Williams, et al., *Proceedings IEEE*, vol. 71, pp. 359-416, Jan. 1983.
"A Logic Design Structure for LSI Testability", Eichelberger, et al., *Proceedings -th Design Automation Conf.*, Jun., 1977.
"Built-in Self-Test Techniques" by E. J. McClusky, *IEEE Design and Test*, vol. 2, No. 2, pp. 21-28.
"Built-in Self-Test Structures" by E. J. McClusky, *IEEE Design and Test*, vol. 2, No. 2, pp. 29-36.
"Voltage Checking Device" by G. Canard and A. Potocki, *IBM Technical Disclosure Bulletin*, vol. 8, No. 5, Oct. 1965.

*Primary Examiner*—Terrell W. Fears
*Attorney, Agent, or Firm*—Townsend and Townsend

[57] ABSTRACT

A desired signal level is set at select storage elements of an integrated circuit without relying on signals applied to the primary input pins of the integrated circuit. Instead, a signal is applied through a test matrix to the input, output or internal line of a select storage element. With the drive of the applied signal being greater than the drive of the signals occurring at the select storage element of the integrated circuit, the applied signal level magnitude is forced upon the storage element. Once the drive of the applied signal is reduced relative to the drive of the storage element signals so as to be less than or equal to the drive of the storage element signals, the output level of the select storage element remains at the desired level. According to one embodiment, the power supply of the test electronics which generates the applied signal is of greater magnitude than the integrated circuit power supply at power up during the state-setting operation to achieve the greater relative drive. During a state-observing operation, the power supply voltage of the test electronics is approximately equal to the power supply voltage of the integrated circuit so as not to inadvertently change the output state of the select storage element.

24 Claims, 6 Drawing Sheets

METHOD AND APPARATUS FOR SETTING DESIRED SIGNAL LEVEL ON STORAGE ELEMENT

BACKGROUND OF THE INVENTION

This invention relates to an apparatus and method for setting desired signal levels at select storage elements of an integrated circuit. More particularly, this invention relates to an apparatus and method for setting the desired signal levels at select storage elements by overpowering the logic state that would otherwise occur. Further, this invention relates to an apparatus and method for setting the desired signal levels without supplying the desired levels through primary input pins of the integrated circuit, but rather through a matrix of predefined test points.

During testing of integrated circuits (ICs), it is necessary to force specific logic states at select storage elements. Typically, this has been accomplished by using the primary input pins of the IC. As integrated circuits become more complex, it is more difficult to define the desired logic states using the primary input pins of the IC. For example, in complex ICs, the states of many logic gates and storage element output lines may not be defined readily through the primary pins because of the many circuit levels between such gates or elements and the primary input pins.

One approach for defining logic states at a storage element is commonly referred to as SCAN. See "Design For testability—A Survey" by T. W. Williams and K. P. Parker, *Proceedings IEEE*, Vol. 71, pp 98–112, January 1983; and "A Logic Design Structure For LSI Testing" by E. B. Eichelberger and T. W. Williams, *Proceedings 14th Design Automation Conference*, June 1977 77CH1216-1C, pp. 462–468. Also see "Built-in Self-Test Techniques" and "Built-in Self-Test Structures" by E. J. McClusky, *IEEE Design and Test*, Vol. 2, No. 2, pp. 437–452. Also see U.S. Pat. Nos. 3,806,891 (Eichelberger et. al.); 3,761,675; 4,293,919 (Dasgupta et. al.) and 4,513,418 (Bardell, Jr. et. al.) assigned to the IBM Corporation which disclose the serial connection of flip-flops into a shift register to allow access to them through "fewer" test points.

According to the SCAN approach, the integrated circuit is designed to tie the select storage elements to one or more shift register chains. The shift registers can thereafter be loaded through test contacts or through the primary input pins during a test, enabling the desired logic states to be loaded to the select storage elements. In effect, the conventional SCAN approaches multiplex the input to the storage element so that during testing, the test circuitry generates the input signal, whereas during normal operation the normal integrated circuit logic generates the input signal.

Drawbacks of the SCAN approach are the resulting increase in surface area, the resulting increase in circuit delay times during normal operation and cumbersome design constraints. Typically an integrated circuit designed to conform to the SCAN approach suffers a 10% speed loss and 20% area loss attributable to the SCAN methodology. Accordingly, a more effective approach for setting predefined levels at select storage elements during testing is needed.

Other approaches for defining logic states or monitoring internal components of circuitry, including integrated circuits, are described in U.S. Pat. No. 4,613,970 for INTEGRATED CIRCUIT DEVICE AND METHOD OF DIAGNOSING THE SAME; EPO patent publication number 223 714 A2 for SEMICONDUCTOR INTEGRATED CIRCUIT DEVICE WITH TEST CIRCUIT; U.S. Pat. No. 4,517,672 for METHOD AND ARRANGEMENT FOR AN OPERATIONAL CHECK OF A PROGRAMMABLE LOGIC ARRAY; IBM Technical Disclosure Bulletin Vol. 8, no. 5 October 1965, "Voltage Checking Device" by G. Canard and A. Potocki; and U.S. Pat. No. 3,795,859 for METHOD AND APPARATUS FOR DETERMINING THE ELECTRICAL CHARACTERISTICS OF A MEMORY CELL HAVING FIELD EFFECT TRANSISTORS.

In commonly-assigned U.S. Pat. No. 4,749,947 of the same inventor issued Jun. 7, 1988 for GRID-BASED, "CROSS-CHECK" TEST STRUCTURE FOR TESTING INTEGRATED CIRCUITS, a functionally independent, internal grid-based structure for an integrated circuit is disclosed enabling testing of complex integrated circuits. Referring to such structure as shown in FIG. 1 herein, a grid-structure 10 on an integrated circuit 11 is formed of individually accessible probe lines 12 and sense/control lines 14 with electronic switches 16 at the crossings. A probe line 12 is coupled to a switch 16 for defining the switch "ON" or "OFF" state. One end of the switch 16 is coupled to a test point 18 of the integrated circuit 11, while the other end is coupled to a sense/control line 14 for monitoring a signal from the test point 18. Activating a select switch 16 through a corresponding probe line 12 enables monitoring or exciting a test point. The integrated circuit includes primary input pins 19, probe line contacts 20 and sense line contacts 21. The test points 18 are coupled to the input line or output line of a corresponding gate G.

The grid structure described above is used for observing signals at the test points 18. The switches 16 coupled to the test points 18 have a high impedance so as to provide less current drive than the logic gates G. As a result, the switch lines do not alter or disturb the internal signals of the integrated circuit 11 during observation.

Difficulties to be overcome in using such a grid structure to impose a desired signal level on an output line of an internal circuit include the relatively low current drive of the switches 16 relative to the gates G. The benefit given by the lower drive current for observing the test signals is a detriment in writing to gate output lines. The drive current may be increased by using switches having lower impedances, but such lower impedance switches impose larger capacitances, which would slow down the switching speed and disturb the signal outputs during test signal observation. Accordingly, a method of employing the high impedance switches of such a grid-like structure to set desired signal levels at select internal circuits is needed.

While testing an integrated circuit, it is typical to apply test signals to the primary input pins of the IC to form a test pattern which defines specific data input signals to select internal elements of the IC (e.g., SCAN techniques). In addition, it is also known to define such data input signals through test points coupled directly (e.g., cross-check matrix) or indirectly (e.g., SCAN techniques) to the select internal elements. A method of setting desired signal levels for storage elements of an IC by forcing logic states on the select storage elements is needed. Setting the desired signal levels by forcing (e.g., overpowering) logic states otherwise occurring at the select storage elements is needed.

SUMMARY OF THE INVENTION

According to the invention, a desired signal level is set at select storage elements of an integrated circuit at power up, or thereafter, without relying on a sequence of signals applied to the primary input pins of the integrated circuit. A signal, instead, is applied through a matrix of test point access lines to the select storage elements. The desired signal level is imposed on the storage element by overpowering the output state that would otherwise occur.

According to one aspect of the invention, separate power supply voltage signals are used for driving the applied signal and the storage elements of the integrated circuit. When the desired signal level is to be set for a storage element, the power supply for the applied signal is driven harder and with a higher voltage than the power supply for the storage elements. The increased power supply signal drive enables the applied signal to overpower the signal at the storage element otherwise generated. Such overpowering applied signal may be applied at the output line, input line or internal line of the storage element. By reducing the power supply signal drive during normal operation to be equal or less than the storage elements' power supply signal drive, the test circuitry does not alter or disturb the storage element signals other than when invoking a desired signal level. Drive as used herein is meant to include the current drive and voltage drive of a signal (i.e, power supply signal, applied signal) or device (i.e., switch).

According to another aspect of the invention, desired signal levels are forced on the storage elements at power up or thereafter. By driving the applied signal with test circuitry while the storage elements are not powered, the storage element signals can be defined to the desired level at power up. By driving the applied signal with greater power supply drive than the power supply signal for the storage elements, the storage element signals can be set to the desired levels even while power is being applied to the storage elements.

According to another aspect of the invention, desired signal levels are forced on the output lines of select storage elements through respective control lines coupled to the select output lines. The control lines are part of a test line matrix structure designed into an integrated circuit. Such an integrated circuit has a plurality of probe lines oriented in a first direction and a plurality of control lines oriented in a second generally orthogonal direction creating row/column intersections. The integrated circuit includes a switch at each respective row/column intersection. The logic state of the probe line received at a switch defines the "ON" or "OFF" state of the switch. A desired signal level is applied at a control line coupled to one terminal of the switch. During an "ON" state of the switch, the desired signal is applied from the control line through the switch to the output line of the select storage element. To force the output line to have the desired signal level, the power for driving the test line matrix is increased to be greater than that for the integrated circuit storage elements while the storage element is exposed to the desired signal level. Thus, the desired signal is forced on the output line of the storage element by increasing the power signal for the test matrix circuits, turning on a select switch with an external applied signal supplied along a select probe line, applying the desired signal level to the select control line, then restoring the test matrix power level. In addition, a step of powering up the integrated circuit may be included prior to restoring the test matrix power level.

An advantage of this invention is that testing of complex integrated circuits is enhanced by being able to define the state of many storage elements without introducing circuitry having excessive capacitance and without altering or disturbing the integrated circuit storage element signals during observation.

DESCRIPTION OF THE PREFERRED EMBODIMENT

Figure 1:
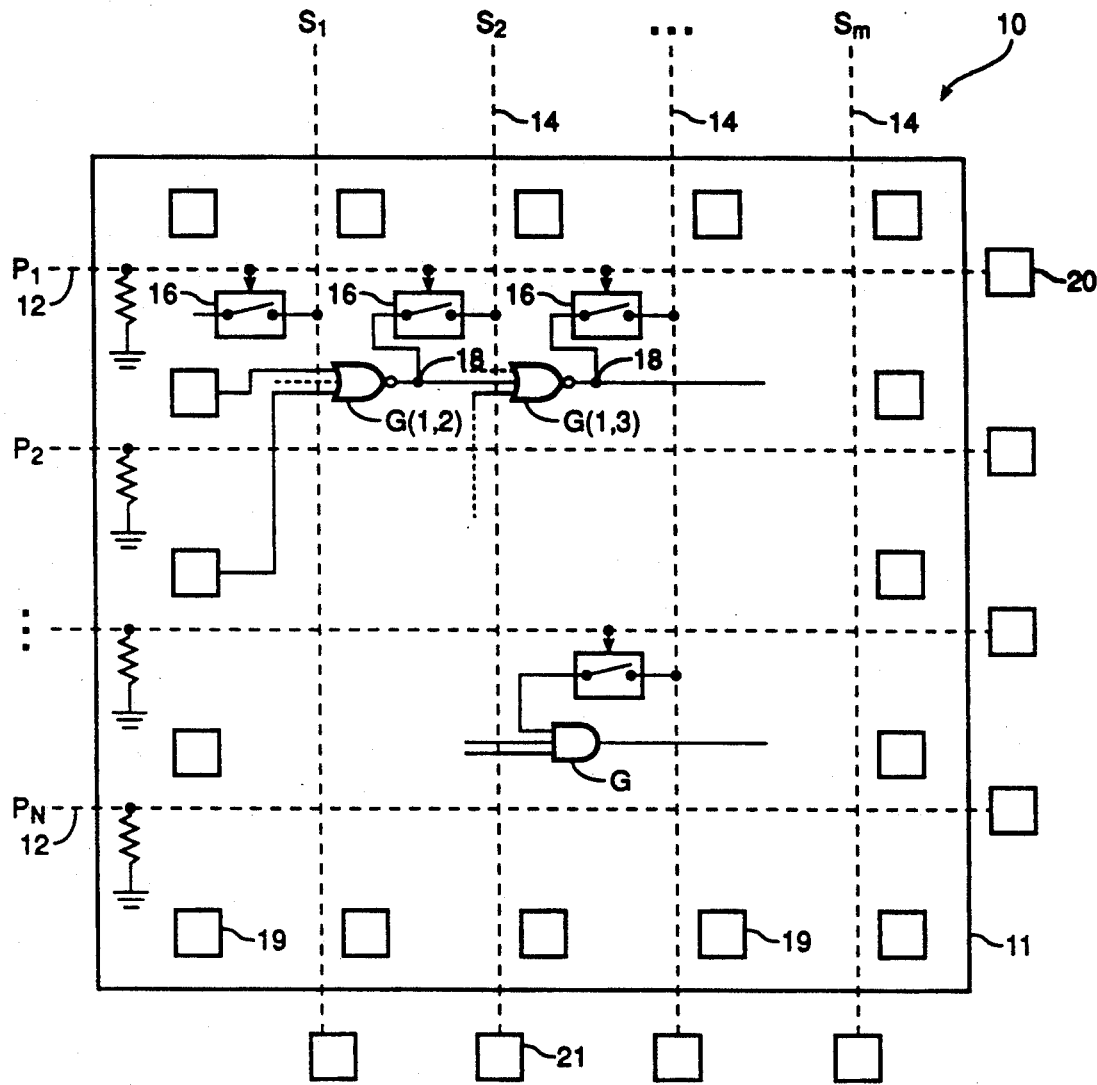
FIG. 1 is a schematic diagram of a test structure on an integrated circuit showing intersecting probe lines and sense lines coupled to electronic switches.
Figure 2:
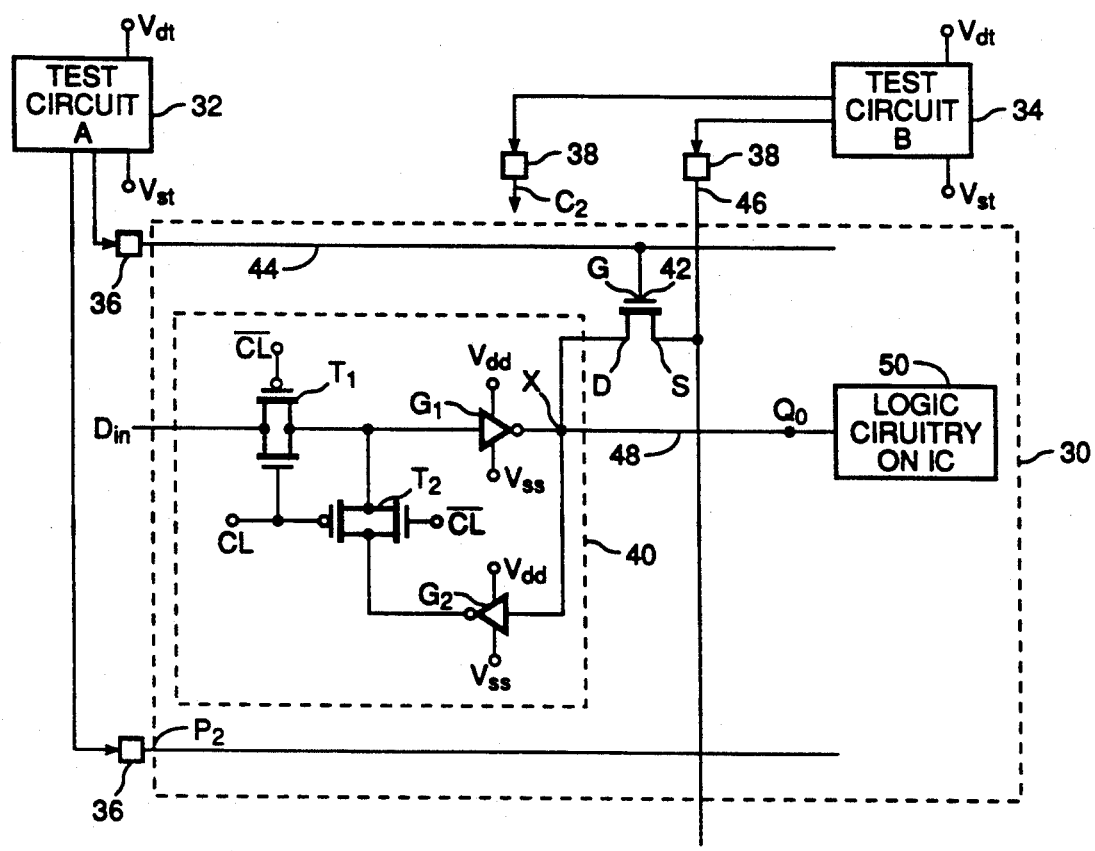
FIG. 2 is a schematic of a storage element having an output coupled to an electronic switch according to a matrix test line structure in which separate power signals are applied to the test electronics and the integrated circuit storage elements.

Referring to FIG. 2, a section of an integrated circuit 30 coupled to test electronics 32 and 34 via test contacts 36, 38 is shown. The integrated circuit 30 includes a storage element 40, a switch 42, a probe line 44 and a control line 46.

The storage element 40 is a conventional storage device and is shown by way of example as a CMOS latch structure including two logic gates G1 and G2 and two transmission gates T1 and T2. Transmission gate T1 is for receiving a data input signal $D_{in}$ for defining the logic state at the storage element output line 48 during normal operation. The transmission gates T1 and T2 are for receiving clock and inverted clock signals which define the timing for the storage element 40.

The signal line 48 of the storage element 40 is coupled to the switch 42 and, according to its normal operation, other logic circuitry 50. The switch 42 is formed of an FET transistor with the probe line 44 coupled to the gate G, the control line 46 coupled to the source S and the output line 48 coupled to the drain D. The logic state of the probe line 44 defines the logic state of the switch 42 (i.e., "ON"/"OFF"; "conductive/non-conductive").

The probe line 44 is coupled to test contact 36. Test contact 36 is for receiving a signal from the test electronics 32 via contact (i.e., probing) or non-contact (i.e., electro-optic) techniques to define the signal level of the probe line 44. Such signal defines the state of the switch 42. The control line 46 is coupled to test contact 38. Test contact 38 is also for receiving a signal from the test electronics 34 via contact or non-contact techniques to define the signal level of the control line 46. Such signal is applied through the switch 42 to the output line 48 of the storage element 40 while the switch 42 is in the conductive state. The probe line and control line signals thus are defined by the test circuits 32, 34.

The test circuits 32, 34 include power supply lines which are independently defined relative to the power supply lines that drive the storage elements 40 and the other non-test circuitry on the integrated circuit 11. Accordingly, the power supply signal $V_{dt}$ for the test circuits 32, 34 may be of greater or lesser drive than that of the power supply signal $V_{dd}$, or equal to the drive and voltage of that of the power supply signal $V_{dd}$. Further, the test circuits 32, 34 can drive the probe lines 44, control lines 46 and switches 42 to apply a signal to the storage element even when the storage elements 40 are not receiving a power signal $V_{dd}$.

According to the invention, to set the storage element 40 to a desired signal level, a signal is applied to the output line 48 while the drive and voltage of the power signal $V_{dt}$ is greater than that of the power signal $V_{dd}$. As a result, the signal applied at the output line 48 is forced upon the storage element 40 by overpowering the signal that would otherwise occur. It is understood that a desired signal level as used herein corresponds to a voltage level of sufficient magnitude to establish a binary logic state unambiguously, i.e., either TRUE (ON) or FALSE (OFF).

The applied signal is provided from test electronics 34 to the test contact 38. Control line 46 receives the signal and carries the signal to the switch 42. With the switch 42 set to a conductive state by applying an appropriate signal along probe line 44, the desired signal is passed from the control line 46 to the output line 48. For a method in which the integrated circuit 30 is already powered up, the greater $V_{dt}$ signal enables the desired signal to overpower the signal level of the output line 48. For a method in which the integrated circuit 30 is to be powered up to achieve the desired storage element 40 state, the desired signal overpowers the indeterminant signal level at which the output line 48 otherwise would appear at power up. Once the desired signal is removed from the output line 48 by turning the switch 42 off, the output signal along output line 48 remains at the level of the prior desired signal.

Although the switch 42 of FIG. 2 is shown connected to the output signal line 48 of the storage element 40, any state-definable signal path of the element 40 may be coupled to the switch 42, instead. Accordingly, the signal output 48 of the element 40 alternatively may be invoked by applying an appropriate signal level at an input line or internal line of the element 40.

Figure 3:
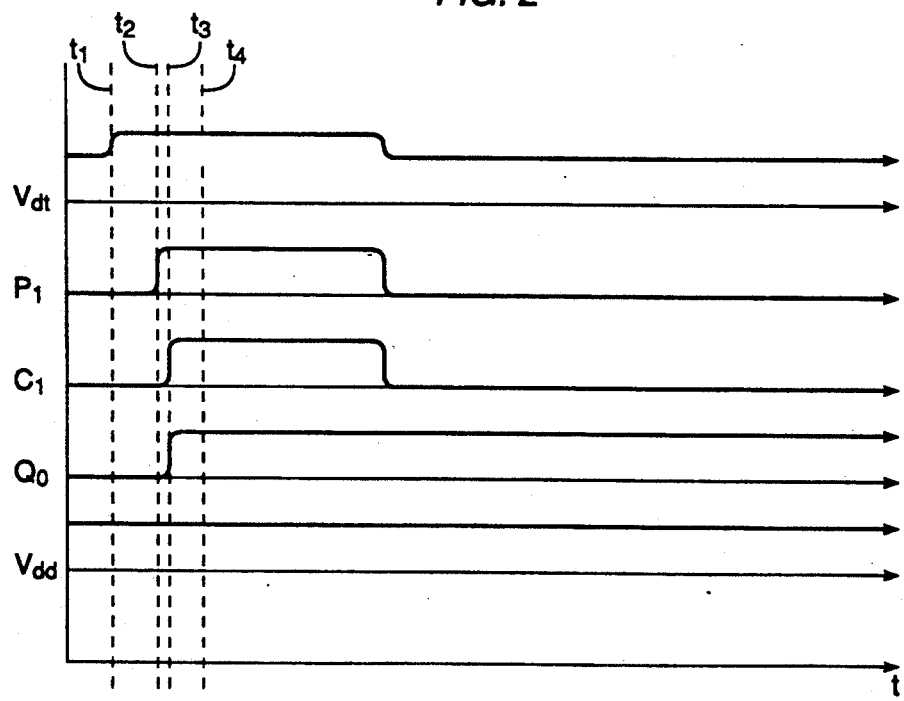
FIG. 3 is a timing diagram illustrating a desired signal level forced upon the output of the storage element of FIG. 2 while power is already being applied to the integrated circuit.

Referring to FIG. 3, a timing diagram is shown for setting the output line 48 to the desired signal level. First, the power signal $V_{dt}$ is increased to a greater drive than that of $V_{dd}$, as shown by the increase in voltage (increase in current not shown). Thereafter, the probe line 44 is excited between times $t_2$ and $t_3$ turning the switch 42 on. A signal from the control line 46 at the desired signal level then is applied between times $t_2$ and $t_3$ to the storage element 40 (i.e., to the output line 48 at point X). The relative timing between the increase in drive of signal $V_{dt}$, the excitation of the probe line 44 to turn on switch 42 and the application of the desired signal level to the control line 46 is not critical. Any order may be used.

The desired signal level then can be locked in by switching the probe line signal $P_1$ so as to turn the switch 42 off and/or reducing the drive of the power signal $V_{dt}$ to be less than or equal to that of the power signal $V_{dd}$. The power signal $V_{dt}$ is altered to have a drive less than or equal to that of the power signal $V_{dd}$ prior to normal operation or observation of the storage elements 40. The currents of each of the power supply signals $V_{dt}$ and $V_{dd}$ may be monitored to compare the relative drives of the two signals. By reducing the drive of the power signal $V_{dt}$ after setting the desired signal levels, the storage element signal 48 is not altered or disturbed by the test circuits 32, 34 during the normal operation, including the test point observation times. (Although, the timing diagram shows the desired signal level as a logic high, the desired signal level alternatively may be a logic low.)

Although an increase in drive of the power supply signal $V_{dt}$ applied to the test circuits 32, 34 is described, alternatively, the drive of the power supply signal $V_{dd}$ may be reduced. Thus, it is the relative drive of signal $V_{dt}$ and signal $V_{dd}$ which is of significance.

Figure 4:
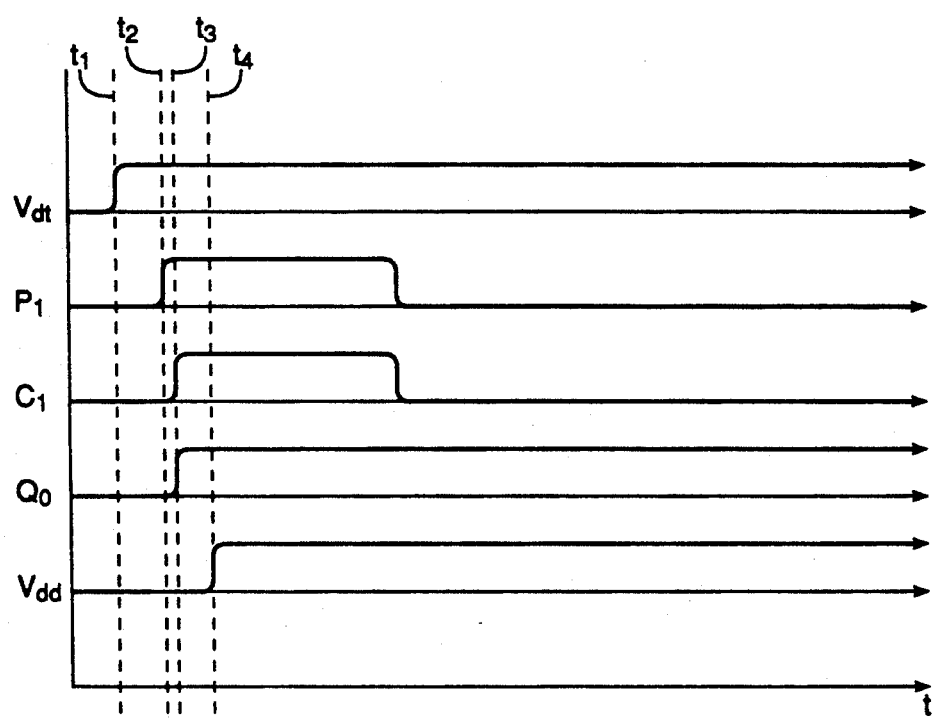
FIG. 4 is a timing diagram illustrating a desired signal level forced upon the output of the storage element of FIG. 2 at power up.

Referring to FIG. 4, a timing diagram is shown for setting the output line 48 to the desired signal level at power up. First, the power to the test electronics 32 and 34 is applied at $t_1$ as shown by the rise in signal $V_{dt}$. Thereafter, the probe line 44 is excited between times $t_2$ and $t_3$, turning the switch 42 on. A signal from the control line 46 at the desired signal level then is applied between times $t_2$ and $t_3$ to the storage element 40 output line 48 at point X. The relative timing between the excitation of the probe line 44 to turn on switch 42 and the application of the desired signal level to the control line 46 is not critical. Either may occur first. Both must occur prior to application of power for the integrated circuit 40 at time $t_4$, as shown by the subsequent rise in power signal $V_{dd}$. Once either or both of the probe and control lines go low, or are otherwise disasserted, the storage element output $Q_0$ remains at the desired level. (Although, the timing diagram shows the desired signal level as a logic high, the desired signal level alternatively may be a logic low.)

Figure 5:
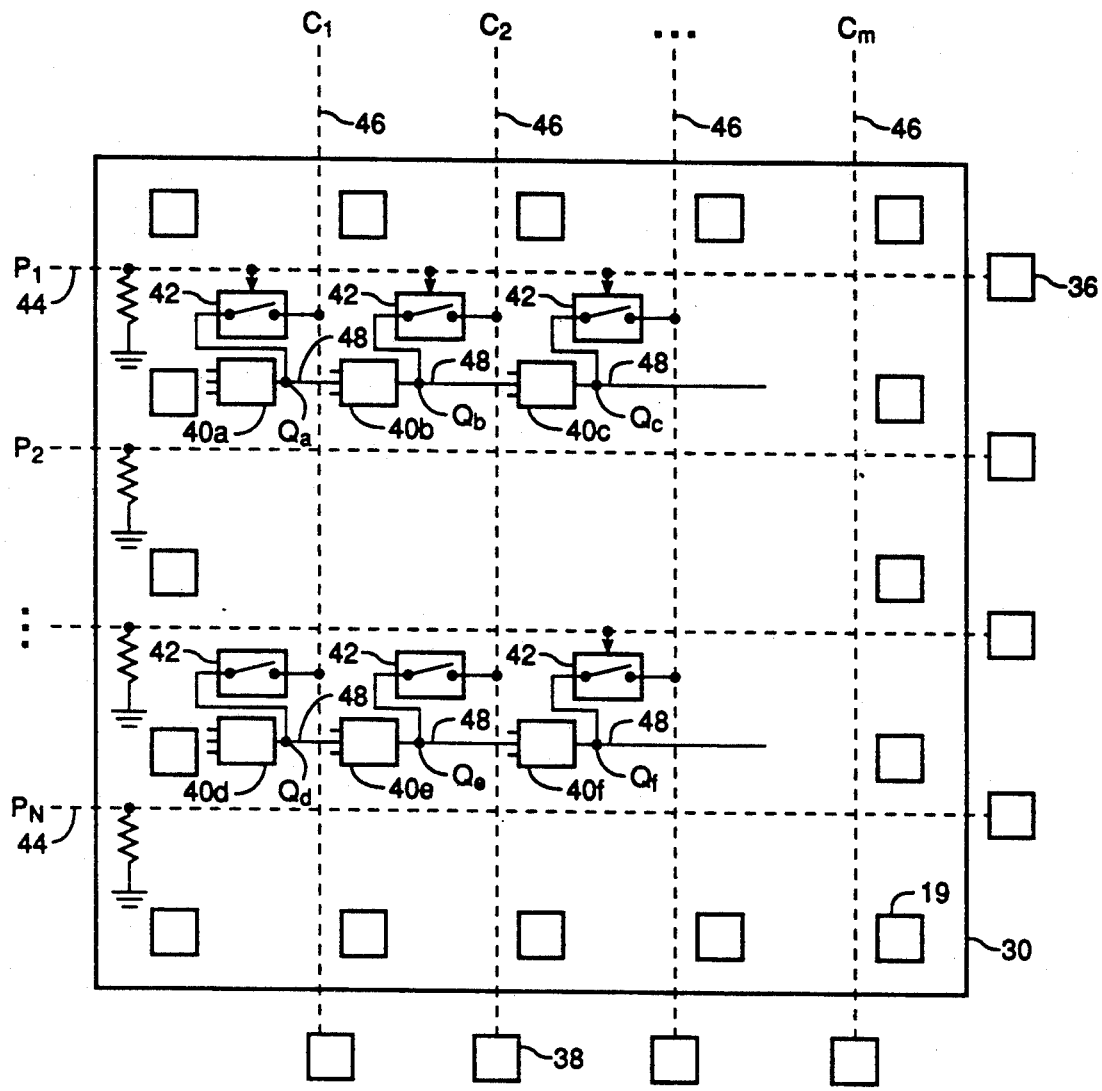
FIG. 5 is a schematic diagram of an integrated circuit having a plurality of storage elements and a matrix of test lines.

Referring to FIG. 5, to set desired signal levels at various storage elements 40, corresponding probe lines 44 and control lines 46 may be accessed as described above to achieve desired signal levels at select storage elements 40a–40f. For example, the integrated circuit 30 may be formed in a dense matrix structure for ease of testing as previously described in a commonly-assigned U.S. Pat. No. 4,749,947 of the same inventor issued Jun. 7, 1988 for GRID-BASED, "CROSS-CHECK" TEST STRUCTURE FOR TESTING INTEGRATED CIRCUITS, and incorporated herein by reference. Select storage elements 40a, 40b, 40c, 40d, 40e, 40f may be addressed by turning on a switch 42 coupled to the select storage elements as described above.

When differing desired signal levels are to be forced at storage elements sharing the same control line, the timing for turning the switches 42 on and off becomes significant. For example, referring to FIG. 5, it is desired to set a logic high at storage elements 40a, 40b, 40c and 40d, and to set a logic low at storage element 40f. A "don't care" condition applies to storage element 40e. Because elements 40a and 40d share the same control line 46 and are both to be set high, there is no conflict. Because elements 40b and 40e share the same control line 46, and 40b is to be high while element 40e is a "don't care," there again is no conflict. However, because elements 40c and 40f share the same control line 46, and 40c is to be high while element 40f is to be low, there is a conflict. Accordingly, the switch 42 coupled to element 40c must be off while the control line 46 is low, and the switch 42 coupled to the element 40f must be off while the control line 46 is high.

Figure 6:
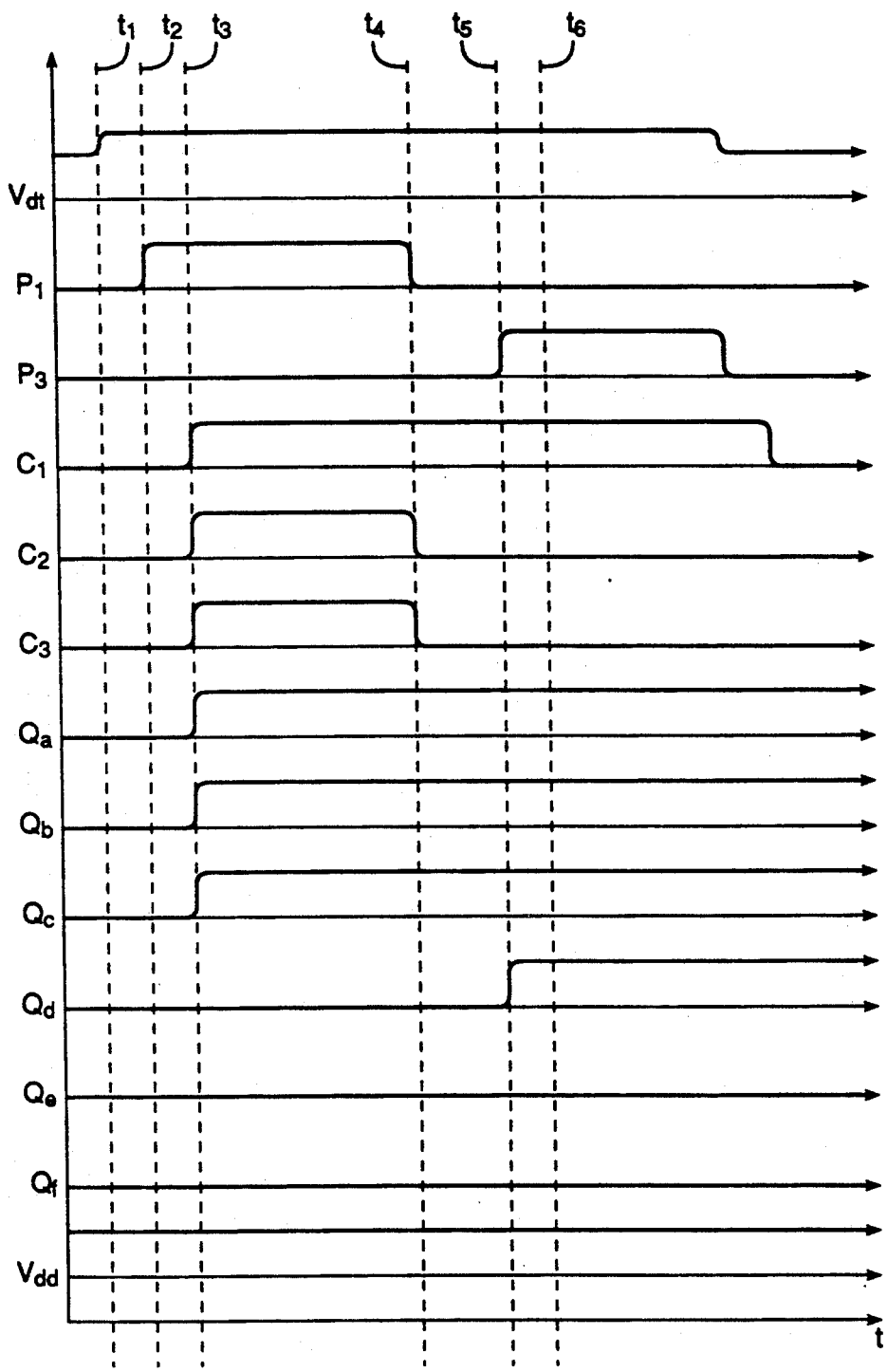
FIG. 6 is a timing diagram illustrating the forcing of desired signal levels upon select storage elements of FIG. 5 while power is applied to the integrated circuit.

Referring to FIG. 6, a timing diagram is shown for achieving the above desired signal level examples for the case in which the power signal $V_{dd}$ is already high. To achieve these desired signal levels, the test control circuits 32, 34 (FIG. 2) are driven harder at time $t_1$ relative to the drive of signal $V_{dd}$, as shown by the voltage increase in line $V_{dt}$. Thereafter, probe line $p_1$ is set high at time $t_2$, while probe line $p_3$ is kept low. Accordingly, the first switches 42 for the storage elements 40a, 40b and 40c (FIG. 5) are activated, while the second switches 42 for storage elements 40d, 40e and 40f are inactive. During the interval marked by $t_3$, the control lines $C_1$, $C_2$ and $C_3$ are set high. This defines the outputs for $Q_a$, $Q_b$ and $Q_c$ as desired. Probe line $p_1$ then goes low at time $t_4$, and probe line $p_3$ goes high at time $t_5$ to activate the second switches for storage elements 40d, 40e and 40f, while deactivating the first switches 42 for storage elements 40a, 40b and 40c. During the general interval that $p_3$ is set high, the control line $C_1$ is set high and the control line $C_3$ is set low. As $Q_2$ is a "don't care," $C_2$ could be either low or high. This defines the outputs for $Q_d$, $Q_e$ and $Q_f$ as desired. Thereafter, the power signal $V_{dt}$ drive is restored to the previous lower level enabling the storage elements 40 to be observed without alteration or disturbance.

Figure 7:
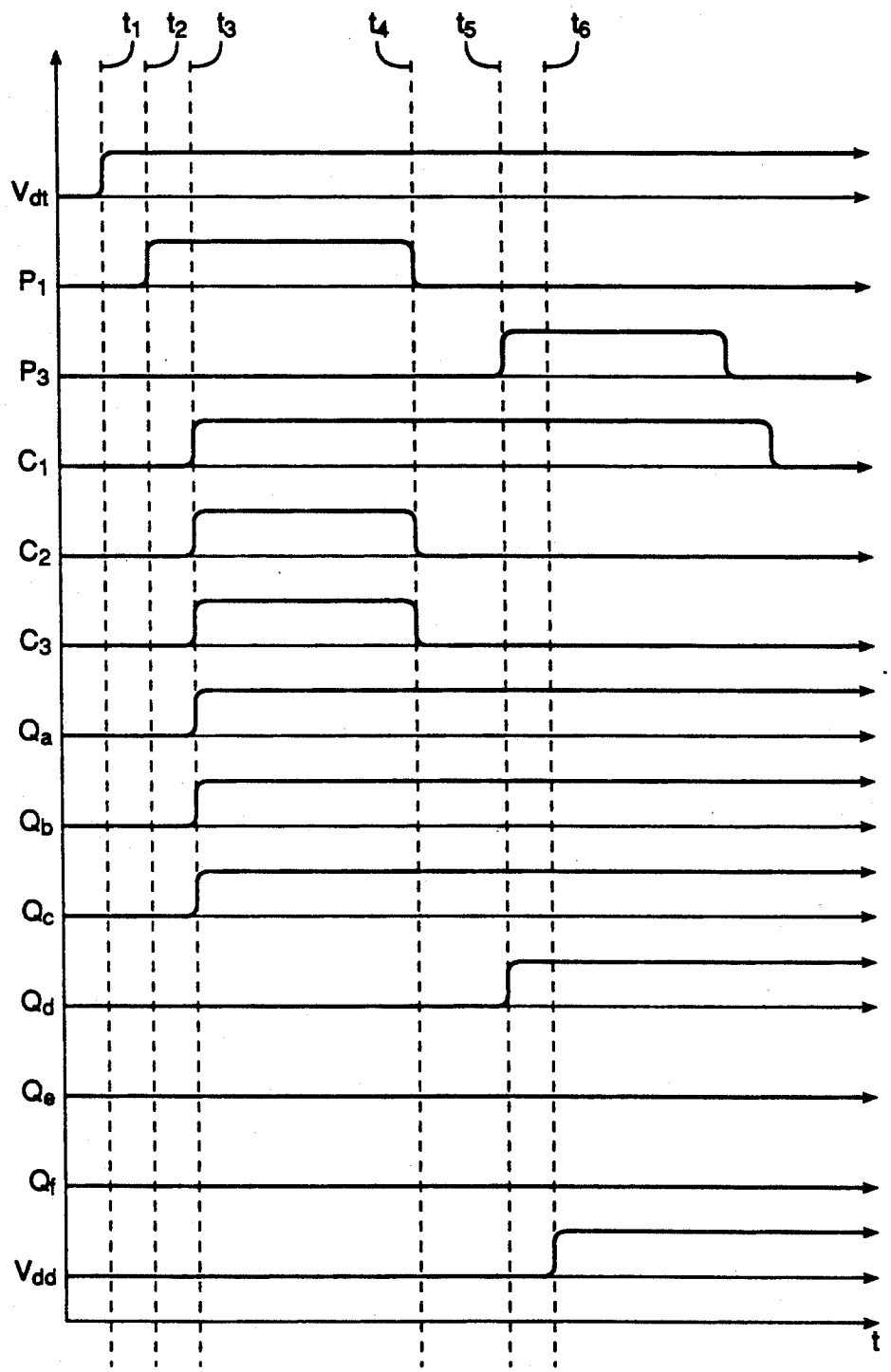
FIG. 7 is a timing diagram illustrating the forcing of desired signal levels upon select storage elements of FIG. 5 at power up.

Referring to FIG. 7, a timing diagram is shown for achieving the above desired signal level examples at power up. Accordingly at power up of the integrated circuit 30, the output lines 48 for $Q_a$, $Q_b$ and $Q_d$ are high and for $Q_c$ and $Q_f$ are low as desired. $Q_e$, which is a "don't care," is a logic low. To achieve these desired signal levels, the test control circuits 32, 34 are powered up at time $t_1$ as shown by the rise in line $V_{dt}$. Thereafter, probe line $p_1$ is set high at time $t_2$, while probe line $p_3$ is kept low. Accordingly, the first switches 42 for the storage elements 40a, 40b and 40c (FIG. 5) are activated, while the second switches 42 for storage elements 40d, 40e and 40f are inactive. During the interval marked by $t_3$, the control lines $C_1$, $C_2$ and $C_3$ are set high. This defines the outputs for $Q_a$, $Q_b$ and $Q_c$ as desired. Probe line $p_1$ then goes low at time $t_4$, and probe line $p_3$ goes high at time $t_5$ to activate the second switches for storage elements 40d, 40e and 40f, while deactivating the first switches 42 for storage elements 40a, 40b and 40c. During the general interval that $p_3$ is set high, the control line $C_1$ is set high and the control line $C_3$ is set low. As $Q_2$ is a "don't care," $C_2$ could be either low or high. This defines the outputs for $Q_d$, $Q_e$ and $Q_f$ as desired. During the interval beginning at time $t_5$ when $p_3$ is set high, the power for the integrated circuit is turned on, locking in each desired voltage signal level.

To avoid losing the desired signal levels for storage elements 40a, 40b and 40c, the power line $V_{dd}$ rises at time $t_6$ before the charge at the respective output lines 48 dissipate. This time is defined by the interval between times $t_4$ and $t_6$ of FIG. 6. The use of high impedance CMOS technology for the storage elements enables the signal to be removed for a period without losing the desired signal level. The interval $t_6-t_4$ is to be less than the discharge time for the output capacitance of each select storage element 40, typically a few milliseconds. Accordingly, the output level for a plurality of storage elements may be set to desired signal levels. Alternatively, $V_{dd}$ may be at a small non-zero voltage (i.e., 1 volt) while setting the desired signal level.

Although a preferred embodiment of the invention has been illustrated and described, the invention may include alternative embodiments and changes. For example, although a crosscheck matrix structure is described for the integrated circuit, the invention is applicable to other types of matrices and other technologies with the appropriate substitutions. Although a conventional latch has been described as the storage element structure, the invention applies to other types of storage elements and storage cells.

Further, although the test circuits 32, 34 and the probe line and sense/control line contacts 36, 38 of FIG. 2 are shown off chip, such circuits and contacts also may be included in the integrated circuit itself. The separate control over the drive for the power signals applied to the test circuits and storage elements, however, still is maintained. Although the same control line signal is shown and described as imposing a logic high or logic low at a select storage element, separate control line signals may be applied through separate switches to define the respective logic high or logic low for the select storage element.

Still further, although the forcing of the storage element state is described as being accomplished by increasing the drive of the power supply signal to the test circuits 32, 34 relative to the drive of the storage element power supply signal, the forcing can be achieved by varying the impedance of the switch so that the drive of the signal applied to the storage element has a greater drive relative to the drive of a signal appearing at the storage element output line, internal line or input line, as appropriate. Accordingly, it is the relative drives of the applied signal and the signal being overpowered which are of significance.

Further, although the relative power signals altered are described as $V_{dt}$ and $V_{dd}$, the relative power signals may be the corresponding ground signals, $V_{st}$ and $V_{ss}$.

Accordingly, the scope of the invention is not intended to be limited, except by the claims.

What is claimed is:

1. A method for setting a desired logic state or observing a current logic state at a select storage element of an integrated circuit, the integrated circuit having an integral testing structure, the testing structure having a control/sense line and a means for coupling the control/sense line to a state-definable signal path of the select storage element, the state-definable signal path having a signal of a first drive during a state-observing operation, the method comprising the steps:

applying a first state-defining signal to said control/sense line during a state-setting operation on said select storage element;

coupling said control/sense line to said state-definable signal path so that a second state-defining signal is applied to the state-definable signal path, the second state-defining signal having a drive greater than said first drive to impose an unambiguous state on the select storage element while said control/sense line is coupled to said state-definable signal path; and modifying a drive of said coupling means after a state-defining operation to a distinct drive which is less than or equal to said first drive so that said coupling means does not alter the state of said select storage element during a state-observing operation on said select storage element in which said state-definable signal path is observed with said coupled control/sense line.

2. The method of claim 1 further comprising the step invoking power to said select storage element while the select storage element is exposed to said second state-defining signal.

3. The method of claim 1 in which the state-definable signal path comprises an output line of the select storage element.

4. A method for setting a desired signal level at a storage element of an integrated circuit, for an integrated circuit having a matrix of probe lines and control/sense lines defining a testing structure for the integrated circuit, the integrated circuit having a switch at one or more probe-line and control/sense-line intersections, the logic on or off state of said switch defined by the state of the corresponding probe line, said switch during an on state conducting a signal on a corresponding control/sense line to a state-definable signal path of the storage element, the state-definable signal path of the storage element coupled to said switch, said storage element receiving a first-power-supply signal, said state-definable signal path having a signal of a first drive, the method comprising the steps:
selecting said storage element by turning on a switch coupled to said select storage element;
applying a state-defining signal to a control/sense line coupled to said switch, said state-defining signal being applied to said state-definable signal path while said switch is selected and said state-defining signal is applied to said control/sense line, said state-defining signal generated to have a drive greater than said first drive to impose an unambiguous state on the select storage element.

5. The method of claim 4, in which said state-defining signal is generated to have a greater drive than said first drive by increasing the drive of said switch for a state-defining operation.

6. The method of claim 5 further comprising the step: decreasing the drive of said switch after a state-defining operation so that said switch coupled to said state-definable signal path does not alter the state of said select storage element during an observation of said select storage element in which said state-definable signal path is observed with said coupled control/sense line.

7. The method of claim 5 in which the drive of the switch is increased by increasing the drive of a second-power-supply signal which is applied to said switch, relative to that of said first-power-supply signal.

8. The method of claim 4 in which said state-defining signal is applied to said control/sense line without being coupled to said control/sense line through a primary pin of the integrated circuit.

9. The method of claim 4 further comprising the step invoking power to said select storage element while the select storage element is exposed to said state-defining signal.

10. The method of claim 4 in which the state-definable signal path comprises an output line of the select storage element.

11. A method for setting a desired signal level at a select storage element of an integrated circuit, for an integrated circuit having a matrix of probe lines and control/sense lines defining a testing structure for the integrated circuit, the integrated circuit having a switch at one or more probe-line and control/sense-line intersections, the logic on or off state of said switch defined by the state of the corresponding probe line, said switch during an on state conducting a signal on a corresponding control/sense line to an output line of the select storage element, the output line of the select storage element coupled to said select switch, the method comprising the steps:
turning on a said switch with a select signal supplied along a select probe line;
applying a state-defining signal to a select control/sense line coupled to said switch, wherein said output line of said select storage element is exposed to said state-defining signal once said switch is turned on and said state-defining signal is applied to said select control/sense line; and
invoking power for said select storage element while said select storage element is exposed to said state-defining signal, the state-defining signal thereby unambiguously determining the state of said select storage element output signal.

12. The method of claim 11 in which said one or more select storage elements include CMOS components forming a high impedance signal path such that an output line of a respective select storage element remains in an established logic state after being exposed to said state-defining signal and after the state-defining signal is no longer applied, prior to applying power to said select storage element.

13. An apparatus for setting a desired logic state at a select storage element of an integrated circuit, the select storage element receiving a first power supply signal, the apparatus comprising:
means integral to said integrated circuit for selecting a storage element to receive a state-defining signal, said selecting means receiving a second power supply signal;
means for generating said state-defining signal to be applied to said select storage element at a state-definable signal path of said storage element;
wherein, during a state-defining operation, said generating means generates said state-defining signal to have a greater drive than a signal occurring at said state-definable signal path of said select storage element, so that said state-defining signal imposes an unambiguous state on the select storage element; and
wherein, during a state-observing operation of said select storage element, said second power supply signal has equal or lesser drive than said first power supply signal so that said applying means does not alter the state of said select storage element.

14. The apparatus of claim 13 in which the means for generating comprises means for applying said state-defining signal to said select storage element, said applying means having a lower output impedance than an impedance of the select storage element at said state-definable signal path.

15. The apparatus of claim 13 in which said generating means comprises:
means for generating a state-defining signal for a logic high state to be applied to said select storage element; and means for generating a state-defining signal for a logic low state to be applied to said select storage element.

16. The apparatus of claim 13 in which said selection means comprises a probe line and a switch, the probe line and switch defining a portion of a testing structure for the integrated circuit, the logic on or off state of said switch determined by the state of the probe line.

17. The apparatus of claim 16 in which said generating means comprises a test signal generating means and a control/sense line coupling said test signal generating means to said switch, the output of said switch defining said state-defining signal.

18. The apparatus of claim 13 in which said state-definable path is an output line of said select storage element.

19. The apparatus of claim 13 in which said state-definable path is an internal line of said select storage element.

20. A method for setting a desired logic state during a state-setting operation and for observing a current logic state during a state-observing operation at a select storage element of an integrated circuit, the integrated circuit having an integral testing structure, the testing structure having a control/sense line and a means for coupling the control/sense line to a state-definable signal path of the select storage element, the state-definable signal path having a signal of a first drive during a state-observing operation, the method comprising the steps:

applying a first state-defining signal to said control/sense line during a state-setting operation on said select storage element;

coupling said control/sense line to said state-definable signal path so that a second state-defining signal is applied to the state-definable signal path, the second state-defining signal having a drive greater than said first drive to impose an unambiguous state on the select storage element while said control/sense line is coupled to said state-definable signal path;

modifying a drive of said coupling means after a state-defining operation to a distinct drive which is less than or equal to said first drive so that said coupling means does not alter the state of said select storage element during a state-observing operation on said select storage element in which said state-definable signal path is observed with said coupled control/sense line; and monitoring, during a state-observing operation, said control/sense line to observe the state of said state-definable path.

21. The method of claim 20 in which the state-definable signal path comprises an output line of the select storage element.

22. The method of claim 20 in which the drive of the state-defining signal is defined by the drive of the coupling means.

23. The method of claim 20 in which said state-defining signal is applied to said control/sense line without being coupled to said control/sense line through a primary pin of the integrated circuit.

24. The method of claim 20 further comprising the step invoking power to said select storage element while the select storage element is exposed to said state-defining signal.

* * * * *